(12) United States Patent
Liu et al.

(10) Patent No.: US 8,917,365 B2
(45) Date of Patent: Dec. 23, 2014

(54) METHOD OF MANUFACTURING TFT-LCD ARRAY SUBSTRATE

(71) Applicant: Beijing Boe Optoelectronics Technology Co., Ltd., Beijing (CN)

(72) Inventors: Xiang Liu, Beijing (CN); Seung Moo Rim, Beijing (CN); Xu Chen, Beijing (CN); Zhenyu Xie, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 13/737,355

(22) Filed: Jan. 9, 2013

(65) Prior Publication Data
US 2013/0122622 A1    May 16, 2013

Related U.S. Application Data

(62) Division of application No. 12/705,694, filed on Feb. 15, 2010, now abandoned.

(30) Foreign Application Priority Data

Feb. 27, 2009    (CN) .......................... 2009 1 0078643

(51) Int. Cl.
G02F 1/136    (2006.01)
G02F 1/1333    (2006.01)
H01L 33/08    (2010.01)
H01L 27/12    (2006.01)

(52) U.S. Cl.
CPC ............ *H01L 33/08* (2013.01); *H01L 27/1214* (2013.01)
USPC ................. 349/43; 349/42; 349/138

(58) Field of Classification Search
USPC ............................... 349/42, 43, 138
See application file for complete search history.

(56) References Cited

U.S. PATENT DOCUMENTS

| | | | |
|---|---|---|---|
| 5,166,816 A * | 11/1992 | Kaneko et al. .................. | 257/59 |
| 6,057,896 A | 5/2000 | Rho et al. | |
| 6,795,151 B2 | 9/2004 | Lee | |
| 6,809,787 B1 | 10/2004 | Seo et al. | |

(Continued)

FOREIGN PATENT DOCUMENTS

| | | |
|---|---|---|
| CN | 1183570 A | 6/1998 |
| CN | 1491371 A | 4/2004 |

(Continued)

OTHER PUBLICATIONS

USPTO NFOA mailed Jun. 10, 2009 in connection with U.S. Appl. No. 11/942,140.

(Continued)

*Primary Examiner* — Jessica M Merlin
(74) *Attorney, Agent, or Firm* — Ladas & Parry LLP

(57) ABSTRACT

A thin film transistor liquid crystal display (TFT-LCD) array substrate comprising a gate line and a data line formed on a base substrate. The gate line and the data line intersect with each other to define a pixel region, in which a pixel electrode and a thin film transistor (TFT) are formed, and a first insulating layer and a second insulating layer are interposed between the gate line and the data line, and the pixel electrode is disposed between the first insulating layer and the second insulating layer. A method of manufacturing a TFT-LCD is also disclosed.

11 Claims, 5 Drawing Sheets

(56) References Cited

U.S. PATENT DOCUMENTS

| | | | |
|---|---|---|---|
| 7,092,049 | B2 | 8/2006 | Kadotani et al. |
| 7,095,469 | B2 | 8/2006 | Kim et al. |
| 7,173,680 | B2 | 2/2007 | Seo et al. |
| 2002/0001048 | A1 | 1/2002 | Lee et al. |
| 2003/0095223 | A1 | 5/2003 | Song |
| 2004/0212761 | A1 | 10/2004 | Kadotani et al. |
| 2004/0227865 | A1 | 11/2004 | Moon |
| 2006/0114397 | A1 | 6/2006 | Mizusako et al. |
| 2008/0108226 | A1* | 5/2008 | Oh et al. ............... 438/762 |
| 2008/0117347 | A1 | 5/2008 | Zhang et al. |
| 2008/0241980 | A1* | 10/2008 | Kobayashi et al. ........ 438/30 |
| 2009/0167974 | A1* | 7/2009 | Choi et al. ............... 349/43 |

FOREIGN PATENT DOCUMENTS

| | | |
|---|---|---|
| CN | 1550858 A | 12/2004 |
| CN | 1567074 A | 1/2005 |
| CN | 1987624 A | 6/2007 |
| CN | 101063781 A | 10/2007 |
| JP | 02-275417 A | 11/1990 |
| JP | 03-198030 A | 8/1991 |
| JP | 05-002189 A | 1/1993 |
| JP | 05-119351 A | 5/1993 |
| JP | 07-181514 A | 7/1995 |
| JP | 08-015711 A | 1/1996 |
| JP | 08-111531 A | 4/1996 |
| JP | 2001-166338 A | 6/2001 |
| JP | 2004-102282 A | 4/2004 |
| JP | 2006-276160 A | 10/2006 |
| KR | 20000047368 A | 7/2000 |
| KR | 20010003061 A | 1/2001 |

OTHER PUBLICATIONS

USPTO NFOA mailed Jan. 21, 2010 in connection with U.S. Appl. No. 11/942,140.

Japanese Office Action dated Oct. 25, 2013; Appln. No. 2010-038635.

Japanese Rejection Decision issued Jul. 28, 2014; Appln. No. 2010-038635.

* cited by examiner

METHOD OF MANUFACTURING TFT-LCD ARRAY SUBSTRATE

BACKGROUND

The present invention relates to a thin film transistor liquid crystal display (TFT-LCD) array substrate and a method of manufacturing the same.

A thin film transistor liquid crystal display (TFT-LCD) has the advantage of small volume, low energy consumption, low radiation, and etc., and thus prevails in the flat panel display market.

A TFT-LCD typically comprises an array substrate and a color filter substrate that face each other. The array substrate is provided with thin film transistors and pixel electrodes, arranged in matrix, each pixel electrode being controlled by a thin film transistor. The pixel electrode is charged when the thin film transistor is on. After charging, the voltage of the pixel electrode remains unchanged until recharging at the time of next scanning. Generally speaking, the capacitance of liquid crystal is small; and thus mere capacitance of the liquid crystal is not able to sustain the voltage of the pixel electrode. For this reason, it is worth providing a storage capacitor to sustain the voltage of the pixel electrode. In principal, a storage capacitor is categorized as a storage capacitor on a gate line (Cs on Gate), a storage capacitor on a common electrode line (Cs on Common), or a combination structure thereof. The combination structure refers to a structure where a portion of the storage capacitors is formed on a gate line and another portion is formed on a common electrode line.

Regardless of the types of the storage capacitor, the gate metal thin film is used as an electrode plate of the storage capacitor. A gate insulating layer and a passivation layer are interposed between the gate metal thin film as one electrode plate and the pixel electrode as another electrode plate of the storage capacitor. The gate insulating layer may have a thickness of 3000 Å-5000 Å, and the passivation layer may have a thickness of 1500 Å-3500 Å. From the formula to calculate the storage capacitance, the value of the storage capacitance in unit area is in inverse to the distance between the two electrode plates. Because the distance between the two electrode plates of the storage capacitor in a conventional TFT-LCD array substrate is great, the storage capacitance in unit area is relatively small.

SUMMARY

An embodiment of the present invention relates to a thin film transistor liquid crystal display (TFT-LCD) array substrate comprising a gate line and a data line formed on a base substrate. The gate line and the data line intersect with each other to define a pixel region, in which a pixel electrode and a thin film transistor (TFT) are formed, and a first insulating layer and a second insulating layer are interposed between the gate line and the data line, and the pixel electrode is disposed between the first insulating layer and the second insulating layer.

Another embodiment of the present invention provides a method of producing a thin film transistor liquid crystal display (TFT-LCD) array substrate, comprising: depositing a gate metal thin film on a base substrate and patterning the gate metal film to form a gate line and a gate electrode; sequentially depositing a first insulating layer and a transparent conductive thin film on the base substrate and patterning the transparent conductive thin film to form a pixel electrode; sequentially depositing a second insulating layer, a semiconductor thin film and a doped semiconductor thin film on the base substrate and patterning the second insulating layer, the semiconductor thin film and the doped semiconductor thin film to form an active layer island and an insulating layer through hole in the second insulating layer, wherein the insulating layer through hole is located over the pixel electrode; and depositing a source/drain metal thin film on the base substrate and patterning the source/drain metal thin film to form a data line, a source electrode, a drain electrode and a TFT channel region. The drain electrode is connected with the pixel electrode via the insulating layer through hole, and the doped semiconductor layer in the TFT channel region is completely etched to expose the underlying semiconductor thin film.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE EMBODIMENTS

The present invention is further described in details with reference to the accompanying drawings and the embodiments.

Figure 1:
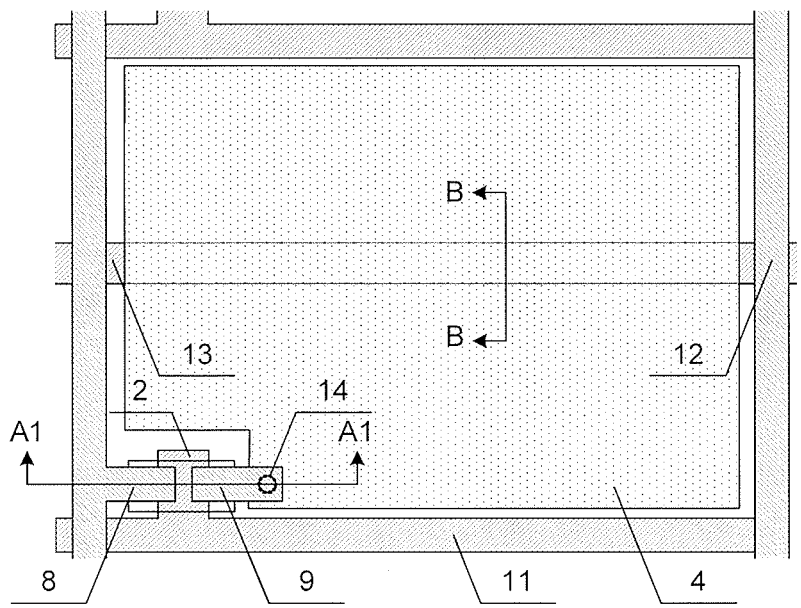
FIG. 1 is a plane view of the TFT-LCD array substrate of a first embodiment of the present invention.
Figure 2:
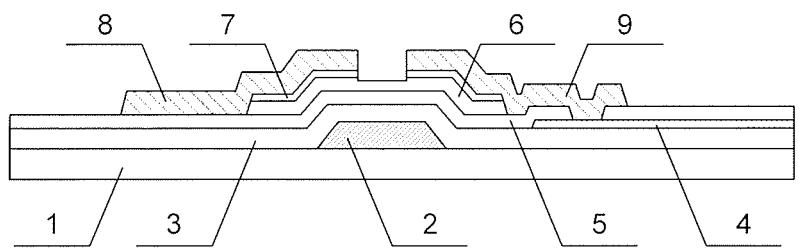
FIG. 2 is a sectional view along line A1-A1 in FIG. 1.
Figure 3:
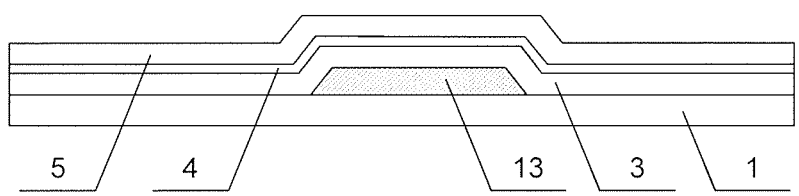
FIG. 3 is a sectional view along line B-B in FIG. 1.

FIG. 1 is a plane view of the TFT-LCD array substrate of a first embodiment of the present invention. The structure of a pixel unit on the array substrate is illustrated. FIG. 2 is a sectional view along line A1-A1 in FIG. 1. FIG. 3 is a sectional view along line B-B in FIG. 1.

As illustrated in FIGS. 1-3, the main structure of the TFT-LCD array substrate of the present embodiment comprises a gate line 11, a data line 12, a common electrode line 13, a pixel electrode 4 and a thin film transistor (TFT) formed on a base substrate 1. The gate line 11 and the data line 12 perpendicularly intersect with each other to define a pixel region. The thin film transistor and the pixel electrode 4 are formed in the pixel region. The gate line 11 is used for providing a gate signal, such as an ON signal, to the thin film transistor; the data line 12 is used for providing data signals to the pixel electrode 4; and the common electrode 13 is used for providing a storage capacitor together with the pixel electrode 4. Since the common electrode line 13 is formed in the pixel region, a structure of a storage capacitor on the common electrode line (Cs on Common) is formed. A first insulating layer 3 is interposed between the common electrode line 13 and the pixel electrode 4.

More particularly, the TFT-LCD array substrate of the present embodiment comprises the gate electrode 2, the gate line 11 and the common electrode line 13 formed on the base substrate 1; the gate electrode 2 is connected with the gate line 11; the common electrode line 13 is located between two adjacent gate lines 11 and parallel to the gate lines 11; the first insulating layer 3 is formed on the gate electrode 2, the gate line 11 and the common electrode line 13 to cover the base substrate 1; a pixel electrode 4 is formed on the first insulating layer 3; and a second insulating layer 5 is formed on the pixel electrode 4 to cover the base substrate 1. An insulating layer through hole 14 is opened through the second insulating layer 5. The insulating layer through hole 14 is located on the pixel electrode 4 and at an edge position of the pixel electrode 4 adjacent to the gate electrode 2 and exposes the pixel electrode 4. An active layer island (comprising a semiconductor layer 6 and a doped semiconductor layer 7) is formed on the second insulating layer 5 and is located above the gate electrode 2. One end of the source electrode 8 of the TFT is formed on the active layer island, and the other end is connected with the gate line 12; one end of the drain electrode 9 of the TFT is formed on the active layer island, and the other end is connected with the pixel electrode 4 via the insulating layer through hole 14. A TFT channel region is formed between the source electrode 8 and the drain electrode 9; the doped semiconductor layer 7 in the TFT channel region is completely etched and a portion of the semiconductor layer 6 is etched so that the semiconductor layer 6 in the TFT channel region is exposed. The semiconductor layer 6 exposed in the TFT channel region can be further subject to an oxidation treatment, and thus an oxide layer (such as a silicon oxide layer) is formed on the exposed surface of the semiconductor layer 6 to protect the TFT channel region. The oxidation treatment has a radio frequency power of 5 KW-13 KW, an air pressure of 100 mT-500 mT, and a flow rate of oxygen of 1000 sccm-4000 sccm.

In the present embodiment, the common electrode line as an electrode plate of the storage capacitor is formed under the first insulating layer, and the pixel electrode as the other electrode plate of the storage capacitor is formed on the first insulating layer. Therefore, the distance between the two electrode plates of the storage capacitor is only equal to the thickness of the first insulating layer. In addition, the drain electrode is located above the pixel electrode, and the drain electrode and the pixel electrode are connected via the insulating layer through hole. The first insulating layer can be deposited by a high rate depositing method to improve production efficiency; the second insulating layer can be deposited by a low rate depositing method, thus the surface of the insulating layer is smooth, and the surface of the film has a good quality. The insulating layer with a high quality surface can match the semiconductor layer formed thereon in a satisfactory way, which is helpful for the transmission of current carrier, and thus the characteristics of TFT can be improved.

FIGS. 4-13 are schematic views of the process for producing the TFT-LCD in the first embodiment. In the following description, the patterning process used in the present application may comprise coating photoresist, masking, exposing and developing the photoresist, etching with the patterned photoresist, removing the remaining photoresist, etc.; for the photoresist, a positive photoresist is taken as an example.

Figure 4:
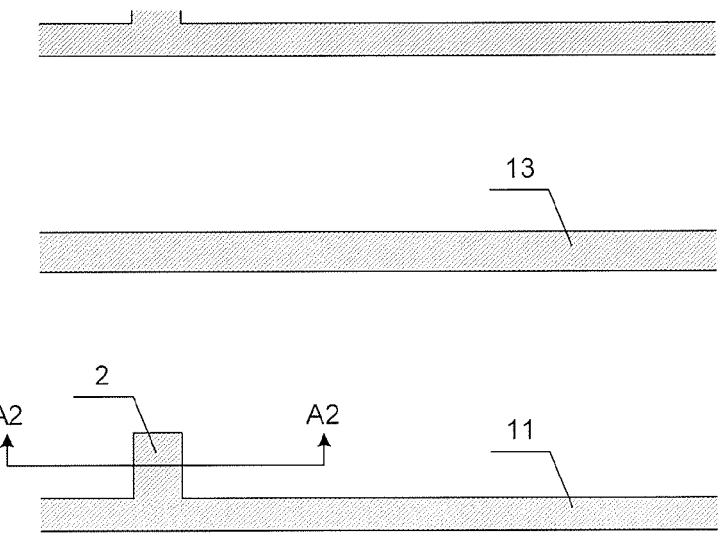
FIG. 4 is a plane view of the TFT-LCD array substrate of the first embodiment after the first patterning process.
Figure 5:
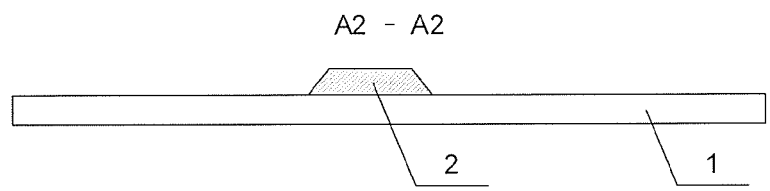
FIG. 5 is a sectional view along line A2-A2 in FIG. 4.

FIG. 4 is a plan view after a first patterning process of the first embodiment of the TFT-LCD array substrate, in which a structure of a pixel unit is illustrated. FIG. 5 is a cross-sectional view in the line A2-A2 in FIG. 4. Firstly, a gate metal thin film having a thickness of 500 Å~4000 Å is deposited on a base substrate 1 (e.g., a glass substrate or a quartz substrate) by using a magnetron sputtering or thermal evaporation method, and the gate metal thin film may be a single layer of a metal selected from the group consisting of Cr, W, Ti, Ta, Mo, Al, Cu and any alloy thereof or may be a complex thin film composed of layers of the above metals. A pattern comprising the gate electrode 2, the gate line 11 and the common electrode line 13 is formed using a normal mask (also referred to as a single tone) by a first patterning process, as shown in FIGS. 4 and 5.

Figure 6:
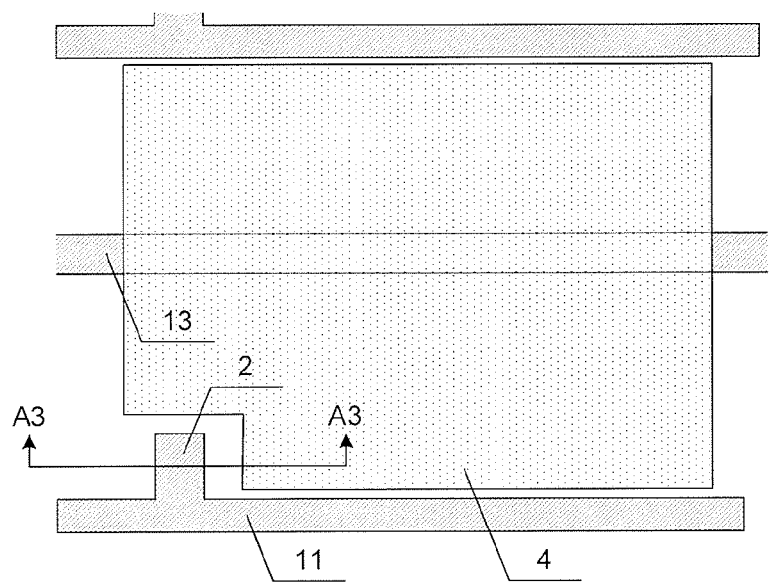
FIG. 6 is a plane view of the TFT-LCD array substrate of the first embodiment after the second patterning process.
Figure 7:
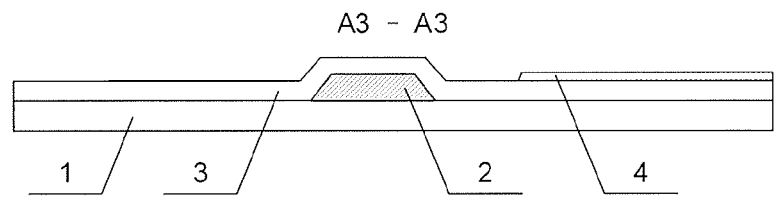
FIG. 7 is a sectional view along line A3-A3 direction in FIG. 6.

FIG. 6 is a plan view after a second patterning process of the first embodiment of the TFT-LCD array substrate, in which a structure of a pixel unit is illustrated. FIG. 7 is a cross-sectional view in the line A2-A2 in FIG. 6. A first insulating layer 3 having a thickness of 2000 Å~5000 Å is deposited on the base substrate by a plasma enhanced chemical vapor deposition (PECVD) method, and subsequently a transparent conductive thin film having a thickness of 300 Å~600 Å is deposited by using a magnetron sputtering or thermal evaporation method. The first insulating layer may be oxide, nitride or oxynitride, and the corresponding reactive gas for forming the layer may be mixed gas of $SiH_4$, $NH_3$ and $N_2$ or mixed gas of $SiH_2Cl_2$, $NH_3$ and $N_2$. The transparent conductive thin film may use a material such as indium tin oxide (ITO), indium zinc oxide (IZO) or aluminum zinc oxide, or other transparent metal materials or transparent metal oxides. A pattern comprising a pixel electrode 4 is formed in the pixel region using a normal mask by a second patterning process, as shown in FIGS. 6 and 7. In the present process, the first insulating layer can be deposited by a high rate depositing method and thereby production efficiency can be improved. In general, depositing rate can be improved by increasing a ratio frequency source power and a flow rate of silane, but the quality of the deposited thin film may be poor and uniformity is bad. In the present embodiment, the high rate deposition has a ratio frequency source power of 4500 W~7000 W, and a flow rate of silane of 900 sccm~1600 sccm.

Figure 8:
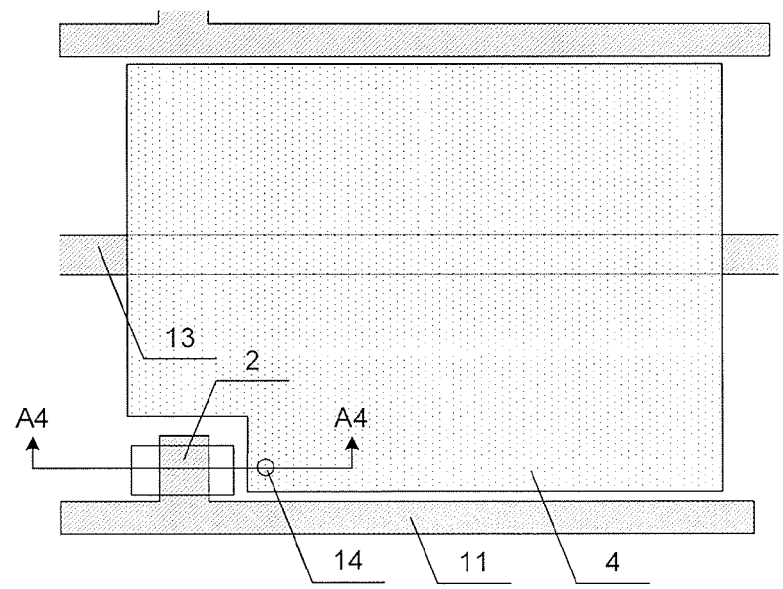
FIG. 8 is a plane view of the first embodiment of the TFT-LCD of the present invention after the third pattering process.
Figure 9:
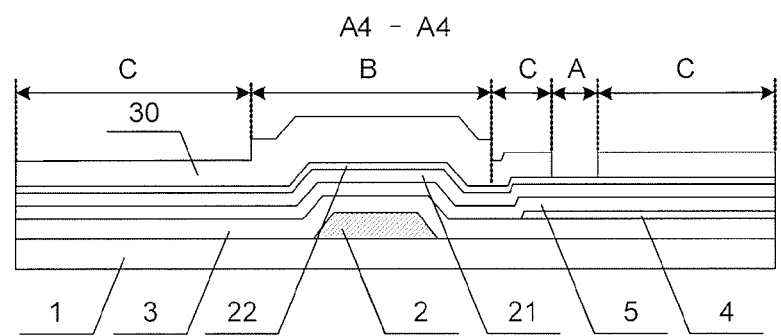
FIG. 9 is a sectional view along line A4-A4 of the first embodiment of the TFT-LCD array substrate after exposing and developing in the third patterning process.

FIG. 8 is a plan view after a third patterning process of the first embodiment of the TFT-LCD array substrate, in which a structure of a pixel unit is illustrated. FIG. 9 is a cross-sectional view along the line A4-A4 after exposing and developing in a third patterning process of the first embodiment of the TFT-LCD array substrate. The second insulating layer 5 having a thickness of 1000 Å~2000 Å, the semiconductor thin film 21 having a thickness 1000 Å~3000 Å, and the doped semiconductor thin film 22 having a thickness 500 Å~1000 Å are sequentially deposited on the base substrate by a PECVD method. The second insulating layer 5 may be oxide, nitride or oxynitride, and the corresponding reactive gas may be mixed gas of $SiH_4$, $NH_3$ and $N_2$ or mixed gas of $SiH_2Cl_2$, $NH_3$ and $N_2$; the corresponding reactive gas for preparing the semiconductor thin film 21 may be mixed gas of $SiH_4$ and $N_2$ or mixed gas of $SiH_2Cl_2$ and $N_2$; the corresponding reactive gas for preparing the doped semiconductor thin film 22 may be mixed gas of $SiH_4$, $PH_3$ and $H_2$, or mixed gas of $SiH_2Cl_2$, $PH_3$ and $H_2$. Subsequently, a layer of photoresist 30 is coated on the doped semiconductor thin film 22, and exposing is performed by using a half tone or gray tone mask so as to render the photoresist comprise a fully exposed region A corresponding to a region where the insulating layer through hole pattern is to be formed, an unexposed region B corresponding to a region wherein the active layer island is to be formed, and a partially exposed region C corresponding to a region other than the above regions. After developing of the exposed photoresist, the thickness of the photoresist in the unexposed region B is unchanged so as to form a photoresist-fully-retained region, the photoresist in the fully exposed region A is removed so as to form a photoresist-fully-removed region, and a portion of the thickness of the photoresist in the partially exposed region C is reduced so as to form a photoresist-partially-remained region, as shown in FIG. 9. In the present process, the second insulating layer can be deposited by a low rate depositing method, thus the surface of this insulating layer is smoother and uniform, and the quality of the film surface is high. Therefore, the second insulating layer having a high quality surface can match with the semiconductor thin film formed thereon better, facilitating transmission of current carrier. The low rate deposition has a ratio frequency source power of 2500 W~4000 W, and a flow rate of silane of 500 sccm~800 sccm.

Figure 10:
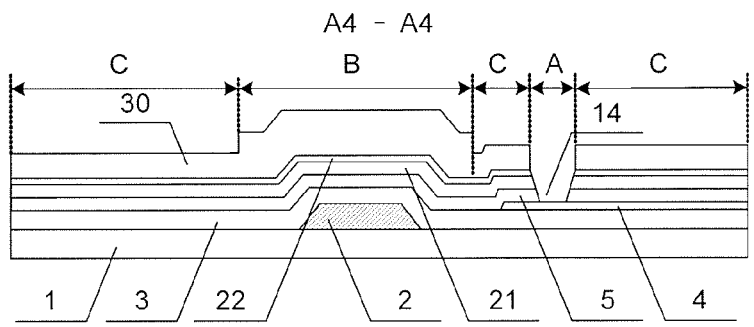
FIG. 10 is a sectional view along line A4-A4 of the first embodiment of the TFT-LCD substrate after the first etching process of the third patterning process.

FIG. 10 is a cross-sectional view along the line A4-A4 after a first etching in the third patterning process of the first embodiment of the TFT-LCD array substrate. The doped semiconductor thin film 22, the semiconductor thin film 21 and the second insulating layer 5 in the fully exposed region A are etched away by the first etching process to form the pattern of the insulating layer through hole 14. The insulating layer through hole 14 is located at an edge position of the pixel electrode 4 adjacent to the gate electrode 2, and the pixel electrode 4 is exposed through the insulating layer through hole 14, as shown in FIG. 10.

Figure 11:
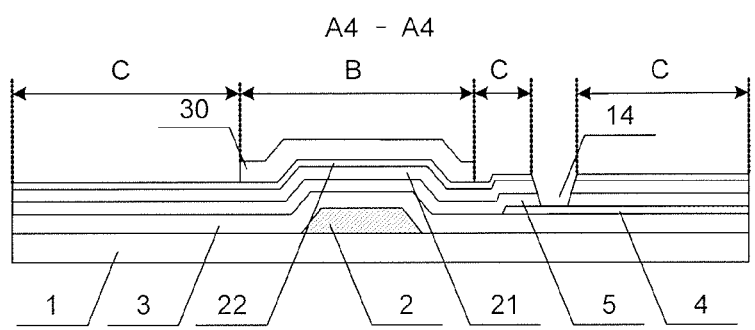
FIG. 11 is a sectional view along line A4-A4 of the first embodiment of the TFT-LCD substrate after an ashing process in the third patterning process.

FIG. 11 is a cross-sectional view along the line A4-A4 after an ashing process in the third patterning process of the first embodiment of the TFT-LCD array substrate. The photoresist in the partially exposed region C is removed by the ashing process so as to expose the underlying doped semiconductor thin film 22 in this region, as shown in FIG. 11. Because the thickness of the photoresist in the unexposed region B is greater than that of the photoresist in the partially exposed region, the unexposed region B is still covered with the remaining photoresist 30 having a certain thickness, after the ashing process.

Figure 12:
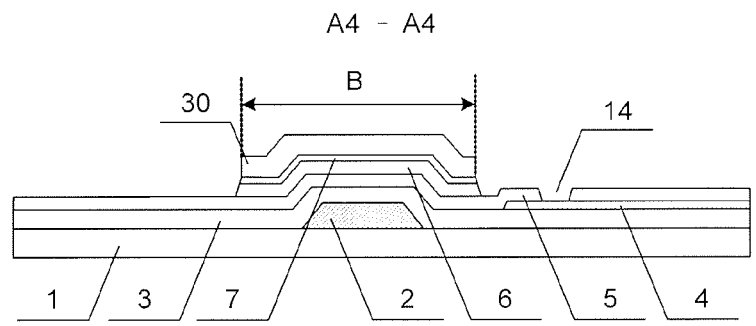
FIG. 12 is a sectional view along line A4-A4 of the first embodiment of the TFT-LCD after a second etching process in the third patterning process.

FIG. 12 is a cross-sectional view along the line A4-A4 after a second etching in the third patterning process of the first embodiment of the TFT-LCD array substrate. The doped semiconductor thin film and the semiconductor thin film in the partially exposed region C are completely etched by the second etching process so as to form the pattern of an active layer island. After patterning, the formed active layer island is located over the gate electrode 2 and comprises the semiconductor layer 6 and the doped semiconductor layer 7 that is stacked on the semiconductor layer 6, as shown in FIG. 12.

Figure 13:
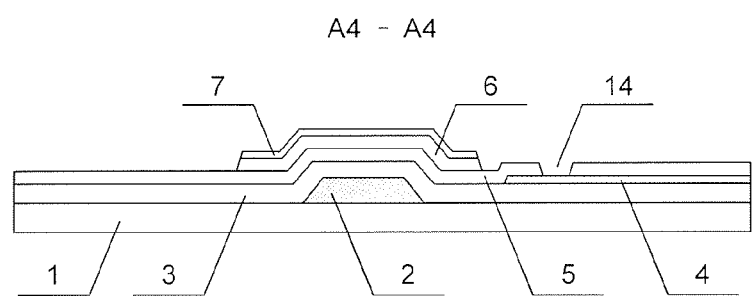
FIG. 13 is a sectional view along line A4-A4 of the first embodiment of the TFT-LCD array substrate after the third pattering process.

FIG. 13 is a cross-sectional view along the line A4-A4 after the third patterning process of the first embodiment of the TFT-LCD array substrate. The remaining photoresist is removed so as to complete the third pattering process of the TFT-LCD array substrate in the first embodiment of the present invention, as shown in FIGS. 8 and 13.

A source/drain metal layer having a thickness of 2000 Å~3000 Å is deposited on the base substrate by using a magnetron sputtering or thermal evaporation method. The source/drain metal layer may be a single layer of a metal selected from the group consisting of Cr, W, Ti, Ta, Mo, Al, Cu and any alloy thereof or may be a complex thin film composed of layers of the above metals. The source/drain metal layer is patterned using a normal mask by a fourth patterning process so as to form the patterns of the data line 12, the source electrode 8, the drain electrode 9 and the TFT channel region. One end of the source electrode is formed on the active layer island and the other end is connected with the data line 12; one end of the drain electrode 9 is formed on the active layer island and the other end is connected with the pixel electrode 4 via the insulating layer through hole 14. The doped semiconductor layer 7 of the TFT channel region formed between the source electrode 8 and the drain electrode 9 is completely etched and a portion of the semiconductor layer 6 is etched so that the semiconductor layer 6 of the TFT channel region is exposed, as shown in FIG. 1~FIG. 3. An oxidation treatment can be performed on the semiconductor layer 6 of the TFT channel region so that an oxide layer (e.g., a silicon oxide layer) is formed on the surface of the exposed semiconductor layer 6, and the oxide layer functions to protect the TFT channel region. The oxidation treatment has a radio frequency power of 5 KW-13 KW, an air pressure of 100 mT-500 mT, and a flow rate of oxygen of 1000 sccm-4000 sccm.

The above-mentioned method comprising four patterning processes is merely a method for producing the TFT-LCD array substrate of the present embodiment, and in practice, the present embodiment can be implemented by increasing or reducing times of patterning processes and selecting different materials or material combination. For instance, the third patterning process of the TFT-LCD array substrate of the present embodiment may be accomplished with the second patterning process being replaced. The active layer island can be formed by one patterning process using a normal mask, and then the insulating layer through hole pattern can be formed by another patterning process using a normal mask.

Figure 14:
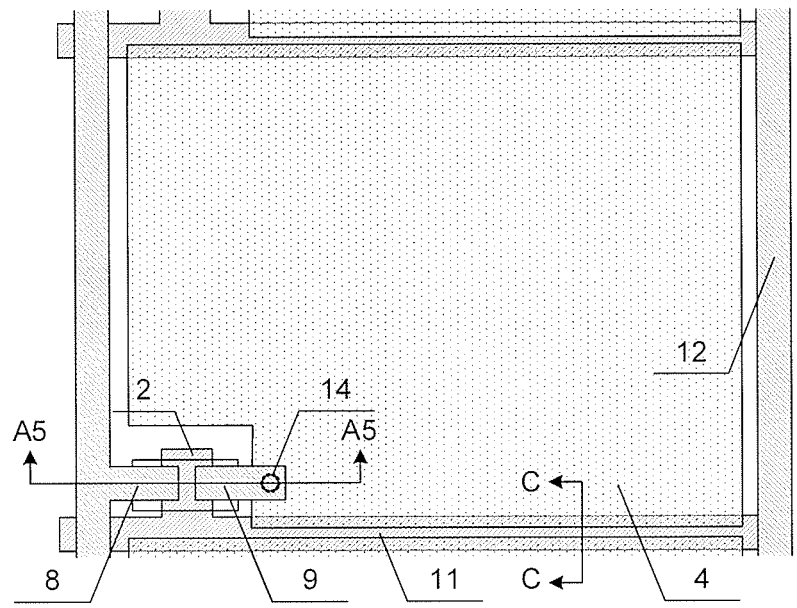
FIG. 14 is a plane view of the TFT-LCD array substrate of a second embodiment of the present invention.
Figure 15:
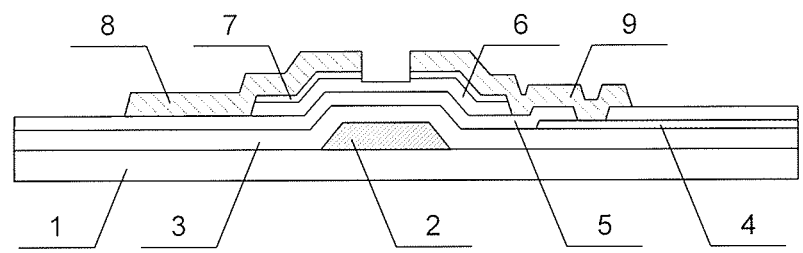
FIG. 15 is a sectional view along line A5-A5 in FIG. 14.

FIG. 14 is a plan view of a TFT-LCD array substrate of a second embodiment of the present invention, in which a structure of a pixel unit is illustrated. FIG. 15 is a cross-sectional view in the line A5-A5 in FIG. 14, and FIG. 16 is a cross-sectional view in the line C-C in FIG. 14.

Figure 16:
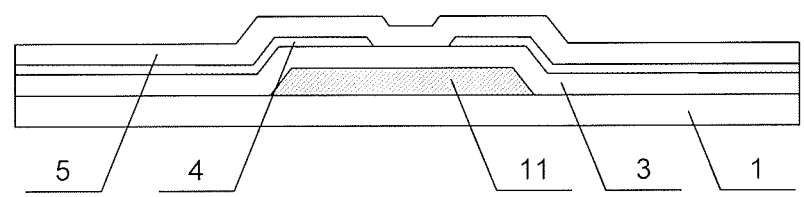
FIG. 16 is a sectional view along direction C-C in FIG. 14.

As shown in FIGS. 14-16, the TFT-LCD array substrate of the present embodiment is of such a structure that a storage capacitor is formed on the gate line (Cs on Gate), and its main body is the same as the array substrate of the first embodiment and comprises a gate line 11, a data line 12, a pixel electrode 4 and a thin film transistor formed on a base substrate 1. The pixel electrode 4 and the gate line 11 constitute the storage capacitor, and only a first insulating layer 3 is interposed between the gate line 11 and the pixel electrode 4.

Particularly, in the TFT-LCD array substrate of the present embodiment, the gate electrode 2 and the gate line 11 are formed on the base substrate 1, and the gate electrode 2 is connected with the gate line 11. The first insulating layer 3 is formed on the gate electrode 2 and the gate line 11 and covers the base substrate 1. The pixel electrode 4 is formed on the first insulating layer 3, at least one side edge of which overlaps with the gate line 11. The second insulating layer 5 is formed on the pixel electrode 4 and covers the base substrate 1, and the insulating layer through hole 14 is provided in the second insulating layer 5 and is located on the pixel electrode 4 and at an edge position of the pixel electrode 4 adjacent to the gate electrode 2. After patterning, the active layer island (comprising a stack of the semiconductor layer 6 and the doped semiconductor layer 7) is formed on the second insulating layer 5 and over the gate electrode 2. One end of the source electrode 8 is formed on the active layer island, and the other end is connected with the data line 12; one end of the drain electrode 9 is formed on the active layer island, and the other end is connected with the electrode 4 via the insulating layer through hole 14. The TFT channel region is formed between the source electrode 8 and the drain electrode 9; the doped semiconductor layer 7 of the TFT channel region is completely etched and a portion of the semiconductor layer 6 is etched so that the semiconductor layer 6 of the TFT channel region is exposed. An oxidation treatment may be performed on the exposed semiconductor layer 6 in the TFT channel region so that an oxide layer may be formed on the exposed surface of the semiconductor layer 6 to protect the TFT channel region.

The process of producing the TFT-LCD array substrate in the present embodiment is substantially the same as that of the first embodiment. The difference lies in that, in the present embodiment, the pattern comprising the gate electrode 2 and the gate line 11 is formed by the first patterning process and the pixel electrode 4 is formed by the second patterning process covers a partial gate line 11. The other same steps are not given in detail for simplicity.

Another embodiment of the present invention can further have such a storage capacitor, one part of which is formed on the gate line and the other part on the common electrode line, i.e., the first embodiment and second embodiment can be combined to form a combination structure. In one aspect, a common electrode line is provided in the pixel region, and on the other aspect, a part of the pixel electrode also covers a partial gate line.

In the above embodiments, the TFT-LCD array substrates are formed by forming two layers of insulating layers and disposing the pixel electrode between the two insulating layers, the pixel electrode forms the storage capacitor with the common electrode line and/or the gate line, and the distance between the two electrode panels of the storage capacitor is only the thickness of the first insulating layer. Compared with the conventional storage capacitor having the gate insulating layer and the passive layer disposed between the two electrode panels, the distance between two electrode panels of the storage capacitor in the embodiments can be decreased apparently, and thus storage capacitance per unit area can be improved. Furthermore, the embodiments adopt the structure of two layers of insulating layer, thus the interface formed between the insulating layer and the semiconductor layer can be in good quality so as to enhance characteristics of the formed TFT. The first insulating layer is formed by using a high rate depositing method, and thus the production efficiency is improved. However, the surface of the insulating layer formed through the high rate deposition is rough, the interface is not in good condition, and therefore good match with the semiconductor layer deposited thereon cannot be obtained. Therefore, a low rate depositing method is used to form the second insulating layer having relative thinner thickness, and the surface of the insulating layer deposited by the low rate method is relatively smooth, uniform and with film surface of high quality. Where the production efficiency is not influenced, the quality of the surface of the insulating layer can be enhanced, a better match with the semiconductor layer thereon can be obtained and the transportation of charge carriers can be realized, and the electric characteristic of the thin film transistor can be improved.

During working of a TFT-LCD, the parasitical capacitance exists between the source electrode and the gate electrode and between the drain electrode and the gate electrode, thus at the moment when the pixel electrode charging is completed, a kickback voltage $\Delta V_p$ is generated. The expression of the kickback voltage is: $\Delta V_p = (V_{gh} - V_{gl})C_{gs}/C_{gs} + C_{lc} + C_s$, wherein $V_{gh}$ is an ON voltage of gate electrode, $V_{gl}$ is an OFF voltage of the gate electrode, $C_{lc}$ is liquid crystal capacitance, $C_{gs}$ is parasitical capacitance, and $C_s$ is storage capacitance. Research shows that existence of the kickback voltage $\Delta V_p$ may cause the change of the polarity of the pixel electrode, and thus it causes the voltages of the positive and negative polarities not in accordance, which causes flicker display and seriously bad influences on display quality, and thus it is better to avoid big kickback voltage $\Delta V_p$ in design. The invention enlarges the storage capacitance per unit area, and thus it ensures adequate sufficient capacitance, and effectively decreases kickback voltage $\Delta V_p$ so as to enhance the display quality.

The embodiment according to the method of manufacturing a TFT-LCD array substrate of this invention may include the following steps.

Step 1, depositing a gate metal thin film on a base substrate and patterning the gate metal film to form a gate line and a gate electrode.

Step 2, sequentially depositing a first insulating layer and a transparent conductive thin film on the base substrate after step 1 and patterning the transparent conductive thin film to form a pixel electrode.

Step 3, sequentially depositing a second insulating layer, a semiconductor thin film and a doped semiconductor thin film on the base substrate after step 2 and patterning the second insulating layer, the semiconductor thin film and the doped semiconductor thin film to form an active layer island and an insulating layer through hole in the second insulating layer. The insulating layer through hole is located over the pixel electrode.

Step 4, depositing a source/drain metal thin film on the base substrate after step 3 and patterning the source/drain metal thin film to form a data line, a source electrode, a drain electrode and a TFT channel region. The drain electrode is connected with the pixel electrode via the insulating layer through hole, and the doped semiconductor layer in the TFT channel region is completely etched.

In this embodiment, in the step 4, the surface of the exposed semiconductor layer can be further oxidized to form an oxide layer in the TFT channel region.

In this embodiment, the first insulating layer and the second insulating film are formed, and the pixel electrode is formed between the first and second insulating layers, thus when the pixel electrode forms storage capacitor with the common electrode or the gate line, the distance between the two electrode panels of the storage capacitor is only the thickness of the first insulating layer. In this case, the distance between the two electrode panels of the storage capacitor can be decreased apparently, and thus the storage capacitance per unit area can be enhanced. Further, the manufactured array substrate adopts the structure of two insulating layers, and therefore it can improve the quality of the interface formed between the insulating layer and the semiconductor layer so as to enhance the characteristics of the TFT.

A first example of the method of manufacturing a TFT-LCD array substrate of this embodiment can includes the following steps.

Step 11, depositing the gate metal thin film on the base substrate and patterning the gate metal thin film to form the gate line, the gate electrode and a common electrode.

Step 12, sequentially depositing the first insulating layer and the transparent conductive thin film on the substrate after step 11 and patterning the transparent conductive thin film to form the pixel electrode by patterning process.

Step 13, sequentially depositing the second insulating layer, the semiconductor layer and the doped semiconductor layer by using plasma enhanced chemical vapor deposition (PECVD) method and then coating a layer of photoresist on the doped semiconductor layer.

Step 14, exposing the photoresist with a half tone or gray tone mask so as to render the photoresist comprise a photoresist-fully-retained region corresponding to a region where the active layer island is to be formed, a photoresist-fully-removed region corresponding to a region where the insulating layer through hole is to be formed, and a photoresist-partially-retained region corresponding to a region other than the above regions. After a developing process, a thickness of the photoresist in the photoresist-fully-retained region is unchanged, the photoresist in the photoresist-fully-removed region is removed, and a thickness of the photoresist in the photoresist-partially-retained region is reduced.

Step 15, etching away, by a first etching process, the doped semiconductor thin film, the semiconductor thin film and the second insulating layer in the photoresist-fully-removed region to form the insulating layer through hole, the insulating layer through hole being located on the pixel electrode and at an edge position of the pixel electrode adjacent to the gate electrode, and pixel electrode being exposed through the insulating layer through hole.

Step 16, removing, by using an ashing process, the photoresist in the photoresist-partially-retained region so as to expose the underlying doped semiconductor thin film of this region.

Step 17, etching away, by a second etching process, the doped semiconductor thin film and the semiconductor thin film in the photoresist-partially-retained region so as to form the active layer island and then removing the remaining photoresist.

Step 18, depositing the source/drain metal thin film on the base substrate after step 17 by using a magnetron sputtering or thermal evaporation method.

Step 19, patterning the source/drain metal thin film with a normal mask so as to form the data line, the source electrode, the drain electrode and the TFT channel region. One end of the source electrode is formed on the active layer island and the other end is connected with the data line; one end of the drain electrode is formed on the active layer island and the other end is connected with the pixel electrode via the insulating layer through hole. In the TFT channel region between the source electrode and the drain electrode, the doped semiconductor layer is completely etched and a portion of the semiconductor layer is etched so that the semiconductor layer of the TFT channel region is exposed.

An oxidation treatment can be further performed on the exposed semiconductor layer of the TFT channel region so that an oxide layer can be formed on the surface of the exposed semiconductor layer in the TFT channel region.

The TFT-LCD array substrate prepared by this example is of a structure of storage capacitance on the common electrode line, and the manufacturing process has been specifically disclosed with reference to the FIGS. 1-13.

The second example of the TFT-LCD array substrate of the embodiment can includes the following steps.

Step 21, depositing the gate metal thin film on the base substrate and patterning the gate metal thin film to form the gate line and the gate electrode.

Step 22, sequentially depositing the first insulating layer and the transparent conductive thin film on the base substrate after step 21 and patterning the transparent conductive thin film to form the pixel electrode. The pixel electrode covers a portion of the gate line.

Step 23, sequentially depositing the second insulating layer, the semiconductor layer and the doped semiconductor layer by using plasma enhanced chemical vapor deposition (PECVD) method and then coating a layer of photoresist on the doped semiconductor layer.

Step 24, exposing the photoresist with a half tone or gray tone mask so as to render the photoresist comprise a photoresist-fully-retained region corresponding to a region where the active layer island is to be formed, a photoresist-fully-removed region corresponding to a region where the insulating layer through hole is to be formed, and a photoresist-partially-retained region corresponding to a region other than the above regions. After a developing process, a thickness of the photoresist in the photoresist-fully-retained region is unchanged, the photoresist in the photoresist-fully-removed region is removed, and a thickness of the photoresist in the photoresist-partially-retained region is reduced.

Step 25, etching away, by a first etching process, the doped semiconductor thin film, the semiconductor thin film and the second insulating layer in the photoresist-fully-removed region to form the insulating layer through hole, the insulating layer through hole being located on the pixel electrode at an edge position of the pixel electrode adjacent to the gate electrode, and pixel electrode being exposed through the insulating layer through hole.

Step 26, removing, by using an ashing process, the photoresist in the photoresist-partially-retained region so as to expose the underlying doped semiconductor thin film of this region.

Step 27, etching away, by a second etching process, the doped semiconductor thin film and the semiconductor thin film in the photoresist-partially-retained region so as to form the active layer island and then removing the remaining photoresist.

Step 28, depositing the source/drain metal thin film on the base substrate after step 27 by using a magnetron sputtering or thermal evaporation method.

Step 29, patterning the source/drain metal thin film with a normal mask so as to form the data line, the source electrode, the drain electrode and the TFT channel region. One end of the source electrode is formed on the active layer island and the other end is connected with the data line; one end of the drain electrode is formed on the active layer island and the other end is connected with the pixel electrode via the insulating layer through hole. In the TFT channel region between the source electrode and the drain electrode, the doped semiconductor layer is completely etched and a portion of the semiconductor layer is etched so that the semiconductor layer of the TFT channel region is exposed.

An oxidation treatment can be further performed on the exposed semiconductor layer of the TFT channel region so that an oxide layer can be formed on the surface of the exposed semiconductor layer.

The TFT-LCD array substrate prepared by this example is of a structure of storage capacitance on the gate line, and the process of the preparation is substantively the same as the first embodiment. The difference lies in that, in step 21 of this example, the gate electrode and the gate line are formed, and the pixel electrode formed in step 22 covers a portion of the gate line.

In the embodiments, the oxidation treatment has the radio frequency power of 5 KW-13 KW, the air pressure of 100 mT-500 mT, and the flow rate of oxygen of 1000 sccm-4000 sccm. The first insulating layer is deposited by a high rate depositing method such that the production efficiency can be enhanced, and the second insulating layer is deposited by a low rate depositing method such that insulating layer with a high quality surface brings a better match with the semiconductor layer formed thereon and is helpful for the transportation of the carrier, and thus improves the electric characteristic of the thin film transistor.

In practice, the structure of a storage capacitor can have a part of storage capacitor on the gate line, and the other part on the common electrode line, i.e., the combination structure of the embodiments.

The embodiments of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A method of producing a thin film transistor liquid crystal display (TFT-LCD) array substrate, comprising:
    depositing a gate metal thin film on a base substrate and patterning the gate metal film to form a gate line and a gate electrode;
    sequentially depositing a first insulating layer and a transparent conductive thin film on the base substrate and patterning the transparent conductive thin film to form a pixel electrode;
    sequentially depositing a second insulating layer, a semiconductor thin film and a doped semiconductor thin film on the base substrate and patterning the second insulating layer, the semiconductor thin film and the doped semiconductor thin film to form an active layer island and an insulating layer through hole in the second insulating layer, wherein the insulating layer through hole is located over the pixel electrode; and
    depositing a source/drain metal thin film on the base substrate and patterning the source/drain metal thin film to form a data line, a source electrode, a drain electrode and a TFT channel region, wherein the drain electrode is connected with the pixel electrode via the insulating layer through hole, and the doped semiconductor layer in the TFT channel region is completely etched to expose the underlying semiconductor thin film,
    wherein the forming of the active layer island and the insulating layer through hole comprises:
    sequentially depositing the second insulating layer, the semiconductor layer and the doped semiconductor layer by plasma enhanced chemical vapor deposition (PECVD) method;
    coating a layer of photoresist on the doped semiconductor layer;
    exposing the photoresist by using a half tone or gray tone mask so as to render the photoresist comprise a photoresist-fully-retained region corresponding to a region where the active layer island is to be formed, a photoresist-fully-removed region corresponding to a region where the insulating layer through hole pattern is to be formed, and a photoresist-partially-retained region corresponding to a region other than the above regions, wherein, after a developing process on the photoresist being exposed, a thickness of the photoresist in the photoresist-fully-retained region is unchanged, the photoresist in the photoresist-fully-removed region is removed, and a thickness of the photoresist in the photoresist-partially-retained region is reduced;
    etching away, by a first etching process, the doped semiconductor layer, the semiconductor layer and the second insulating layer in the photoresist-fully-removed region to form the insulating layer through hole, from which the pixel electrode is exposed;
    removing, by using an ashing process, the photoresist in the photoresist-partially-retained region so as to expose the doped semiconductor layer;
    etching away, by a second etching process, the doped semiconductor layer and the semiconductor layer in the photoresist-partially-retained region so as to form the active layer island; and
    removing the remaining photoresist.

2. The method of producing a TFT-LCD array substrate according to claim 1, wherein the forming of the data line, the source electrode, the drain electrode and the TFT channel region comprises:
    depositing the source/drain metal layer by using a magnetron sputtering or thermal evaporation method; and
    patterning the source/drain metal layer by using a normal mask so as to form the data line, the source electrode, the drain electrode and the TFT channel region,
    wherein one end of the source electrode is formed on the active layer island and the other end of the source electrode is connected with the data line; one end of the drain electrode is formed on the active layer island and the other end of the drain electrode is connected with the pixel electrode via the insulating layer through hole; and the doped semiconductor layer of the TFT channel region between the source electrode and the drain electrode is completely etched and a portion of the semiconductor layer is etched so that the semiconductor layer of the TFT channel region is exposed.

3. The method of producing a TFT-LCD array substrate according to claim 2, wherein an oxidation treatment is performed on the exposed semiconductor layer in the TFT channel region so that an oxide layer is formed on the surface of the semiconductor layer exposed via the doped semiconductor layer.

4. The method of producing a TFT-LCD array substrate according to claim 3, wherein the oxidation treatment has a radio frequency power of 5 KW-13 KW, an air pressure of 100 mT-500 mT, and a flow rate of oxygen of 1000 sccm-4000 sccm.

5. The method of producing a TFT-LCD array substrate according to claim 1, wherein the first insulating layer is deposited by a high rate depositing method, and the second insulating layer is deposited by a low rate depositing method.

6. The method of producing a TFT-LCD array substrate according to claim 5, wherein the high rate deposition has a radio frequency source power of 4500 W-7000 W, a flow rate of silane of 900 sccm-1600 sccm, and the low rate deposition has a radio frequency source power of 2500 W-4000 W, a flow rate of silane of 500 sccm-800 sccm.

7. The method of producing a TFT-LCD array substrate according to claim 1, wherein, when the gate line and the gate electrode are formed, a common electrode line extending in parallel to the gate line is formed and overlaps with the pixel electrode to be formed.

8. The method of producing a TFT-LCD array substrate according to claim 1, wherein the pixel electrode covers a portion of the gate line.

9. The method of producing a TFT-LCD array substrate according to claim 7, wherein the pixel electrode covers a portion of the gate line.

10. The method of producing a TFT-LCD array substrate according to claim 1, wherein an oxidation treatment is performed on the exposed semiconductor layer of the TFT channel region so that an oxide layer is formed on the surface of the semiconductor layer exposed via the doped semiconductor layer.

11. The method of producing a TFT-LCD array substrate according to claim 10, wherein the oxidation treatment has a radio frequency power of 5 KW-13 KW, an air pressure of 100 mT-500 mT, and a flow rate of oxygen of 1000 sccm-4000 sccm.

* * * * *